US009558806B1

(12) United States Patent
Suwa et al.

(10) Patent No.: US 9,558,806 B1
(45) Date of Patent: Jan. 31, 2017

(54) ELECTRONIC DEVICE

(71) Applicant: RENESAS ELECTRONICS CORPORATION, Tokyo (JP)

(72) Inventors: Motoo Suwa, Tokyo (JP); Takafumi Betsui, Tokyo (JP); Masato Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/170,535

(22) Filed: Jun. 1, 2016

(30) Foreign Application Priority Data

Jul. 28, 2015 (JP) ................................. 2015-148308

(51) Int. Cl.
| G11C 5/02 | (2006.01) |
| G11C 11/408 | (2006.01) |
| H01L 23/498 | (2006.01) |
| H01L 25/065 | (2006.01) |
| H01L 23/522 | (2006.01) |
| H01L 23/528 | (2006.01) |
| G11C 5/06 | (2006.01) |

(52) U.S. Cl.
CPC ........... *G11C 11/4085* (2013.01); *G11C 5/025* (2013.01); *G11C 5/063* (2013.01); *G11C 11/408* (2013.01); *H01L 23/49838* (2013.01); *H01L 23/5228* (2013.01); *H01L 23/5283* (2013.01); *H01L 25/0655* (2013.01)

(58) Field of Classification Search
CPC ...................................................... G11C 5/02
USPC .................................................. 365/49.1–52
See application file for complete search history.

(56) References Cited

U.S. PATENT DOCUMENTS

| 6,433,393 B1 * | 8/2002 | Narita ................. H01L 27/0262 |
| | | 257/355 |
| 7,633,147 B2 * | 12/2009 | Funaba ................. H01L 23/552 |
| | | 257/685 |
| 7,804,735 B2 | 9/2010 | Mao et al. | |
| 7,929,332 B2 * | 4/2011 | Fujita ................. G06F 12/0891 |
| | | 365/154 |

(Continued)

FOREIGN PATENT DOCUMENTS

JP      2011-513845 A     4/2011

OTHER PUBLICATIONS

"Low Power Double Data Rate 4JEDEC (LPDDR4)." JEDECSTANDARD, JESD209-4 JEDEC Solid State Technology Association, Aug. 2014, Arlington, Virginia.

*Primary Examiner* — Harry W Byrne
(74) *Attorney, Agent, or Firm* — McDermott Will & Emery LLP

(57) ABSTRACT

The number of terminals included in a semiconductor device which is included in an electronic device is reduced. The electronic device includes: a first semiconductor device having first and second input terminals; a second semiconductor device having a first output terminal and a first driver circuit to drive the first output terminal; and a wiring substrate over which the first and second semiconductor devices are mounted. The first and second input terminals are commonly coupled to the first output terminal via a first line formed on the wiring substrate. A composite resistance value of first and second termination resistors coupled to the first and second input terminals, respectively, is equivalent to a drive impedance of the first driver circuit.

20 Claims, 10 Drawing Sheets

(56) References Cited

U.S. PATENT DOCUMENTS

| | | | | |
|---|---|---|---|---|
| 8,259,487 B2 * | 9/2012 | Fujita | ................ | G06F 12/0891 |
| | | | | 365/154 |
| 2004/0196682 A1 * | 10/2004 | Funaba | ................ | H01L 23/552 |
| | | | | 365/149 |
| 2008/0291755 A1 * | 11/2008 | Matsui | ................ | G11C 7/1051 |
| | | | | 365/189.15 |
| 2009/0003051 A1 * | 1/2009 | Fujita | ................ | G06F 12/0891 |
| | | | | 365/174 |
| 2011/0188296 A1 * | 8/2011 | Fujita | ................ | G06F 12/0891 |
| | | | | 365/154 |

* cited by examiner

FIG. 3

|   | 1 | 2 | 3 | 4 | 5 | 8 | 9 | 10 | 11 | 12 |
|---|---|---|---|---|---|---|---|---|---|---|
| A |   |   |   |   |   |   |   |   |   |   |
| B |   | DQ0_A |   | DQ7_A |   |   | DQ15_A |   | DQ8_A |   |
| C |   | DQ1_A |   | DQ6_A |   |   | DQ14_A |   | DQ9_A |   |
| D |   |   | DQS0_t_A |   |   |   |   |   | DQS1_t_A |   |
| E |   | DQ2_A | DQS0_c_A | DQ5_A |   |   | DQ13_A | DQS1_c_A | DQ10_A |   |
| F |   | DQ3_A |   | DQ4_A |   |   | DQ12_A |   | DQ11_A |   |
| G |   | ODT_CA_A |   |   |   |   |   |   |   |   |
| H |   | CA0_A | CS1_A | CS0_A |   |   | CA2_A | CA3_A | CA4_A |   |
| J |   | CA1_A |   | CKE0_A | CKE1_A | CK_t_A | CK_c_A |   | CA5_A |   |
| K |   |   |   |   |   |   |   |   |   |   |
| N |   |   |   |   |   |   |   |   |   |   |
| P |   | CA1_B |   | CKE0_B | CKE1_B | CK_t_B | CK_c_B |   | CA5_B |   |
| R |   | CA0_B | CS1_B | CS0_B |   |   | CA2_B | CA3_B | CA4_B |   |
| T |   | ODT_CA_B |   |   |   |   |   |   | RESET_n |   |
| U |   | DQ3_B |   | DQ4_B |   |   | DQ12_B |   | DQ11_B |   |
| V |   | DQ2_B | DQS0_c_B | DQ5_B |   |   | DQ13_B | DQS1_c_B | DQ10_B |   |
| W |   |   | DQS0_t_B |   |   |   |   |   | DQS1_t_B |   |
| Y |   | DQ1_B |   | DQ6_B |   |   | DQ14_B |   | DQ9_B |   |
| AA |   | DQ0_B |   | DQ7_B |   |   | DQ15_B |   | DQ8_B |   |
| AB |   |   |   |   |   |   |   |   |   |   |

ELECTRONIC DEVICE

CROSS-REFERENCE TO RELATED APPLICATIONS

The disclosure of Japanese Patent Application No. 2015-148308 filed on Jul. 28, 2015 including the specification, drawings and abstract is incorporated herein by reference in its entirety.

BACKGROUND

The present invention relates to an electronic device, for example, one configured with an LPDDR4 (low power double data rate 4) SDRAM (synchronous DRAM) and a controller therefor both included in a SiP (system in package).

In Japanese Translation of PCT International Application Publication No. 2011-513845, for example, a dual-channel memory architecture is disclosed which is configured with a first memory device and a second memory device. The first memory device is coupled to a memory controller using a common address bus and a first clock signal. The second memory device is coupled to a memory controller using a common address bus and a second clock signal. The polarity of the second clock signal is a reversal of the polarity of the first clock signal. JEDEC Standard JESD209-4 includes the LPDDR4 standard.

SUMMARY

For example, LPDDR4 unlike the related-art LPDDR3 employs a two-channel architecture in which two-channel memory arrays are included in a single chip. In a two-channel architecture, control signals such as CA (command address) signals and CS (chip select) signals are provided for two channels in one chip. Correspondingly, a controller chip to access an LPDDR4 memory chip normally has control signal output terminals for two channels.

In this case, however, the number of terminals to be included in the controller chip increases possibly causing the chip size and cost to increase. This problem is more conspicuous when the number of memory chips coupled to the controller chip is larger.

The embodiments of the present invention being described in the following have been made in view of the above problem, and other objects and novel features of the present invention will become apparent from the following description of this specification and attached drawings.

The electronic device according to an embodiment includes: a first semiconductor device having first and second input terminals; a second semiconductor device having a first output terminal and a first driver circuit to drive the first output terminal; a wiring substrate over which the first and second semiconductor devices are mounted; and first and second termination resistors terminating the first and second input terminals, respectively. The first and second input terminals are commonly coupled to the first output terminal via a first line formed on the wiring substrate. A composite resistance value of the first and second termination resistors is equivalent to a drive impedance of the first driver circuit.

According to the above embodiment, the number of terminals included in a semiconductor device which is included in an electronic device can be reduced.

BRIEF DESCRIPTION OF THE DRAWINGS

FIG. 3 is a plan view schematically showing a layout of the external terminals included in the memory device shown in FIG. 2.

DETAILED DESCRIPTION

Figure 1A:
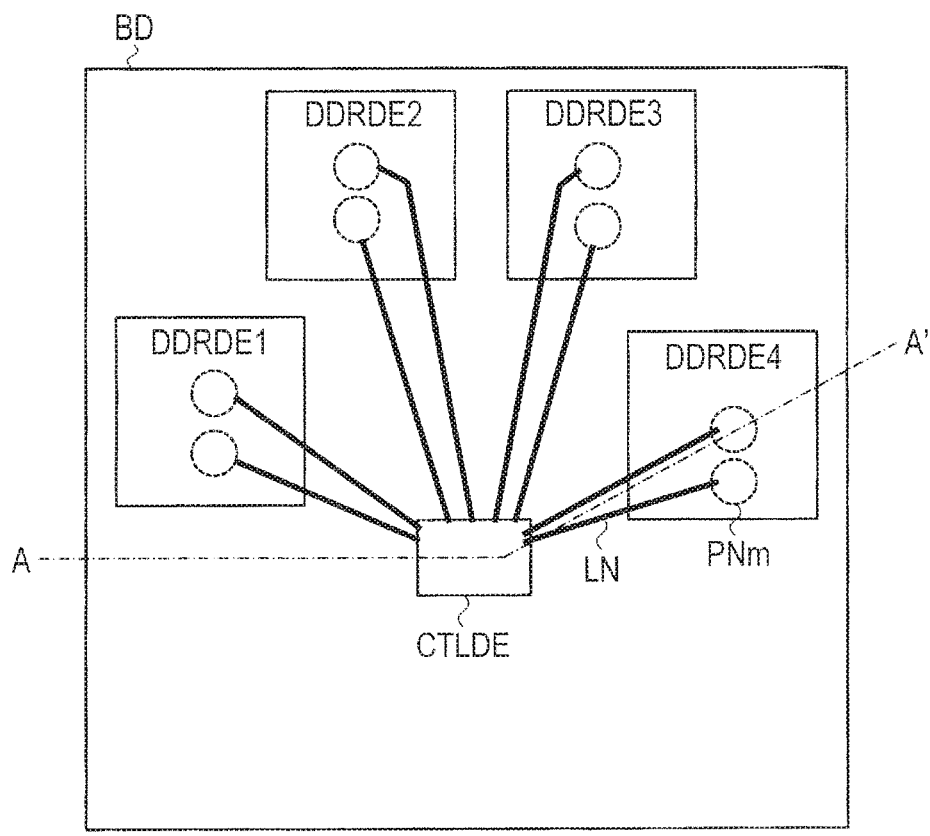
FIG. 1A is a plan view schematically showing an example of an external configuration of an electronic device according to a first embodiment of the present invention.

In the following, the description of the invention will be divided into two or more sections or will range over two or more embodiments as required for the sake of convenience. Unless otherwise expressed, such sections and embodiments are not mutually irrelevant. For example, among such sections and embodiments, one is a partial or total modification of another, or one elaborates or supplements another. Also, numbers referred to in the following description of embodiments (for example, numbers representing counts, numerical values, volumes, or ranges) do not represent defined values, that is, they may be smaller or larger unless otherwise expressed or except when they are apparently defined in principle.

Furthermore, the constituent elements (including element steps) of the following embodiments are not necessarily indispensable unless otherwise expressed or except when they are considered apparently indispensable in principle. Similarly, the shapes of and positional relationships between constituent elements referred to in the following description are inclusive of those substantially close to or similar to them unless otherwise expressed or except when such shapes and positional relationships are apparently considered strictly defined in principle. This also applies to the numerical values and ranges.

The circuit elements included in function blocks used in the following embodiments are formed, though not limited to, over a semiconductor substrate of, for example, monocrystalline silicon using integrated circuit technology, for example, publicly known CMOS (complementary metal-oxide semiconductor) technology.

In the following, embodiments of the present invention will be described in detail with reference to drawings. Note that, in the drawings referred to in describing the following embodiments, identical members are denoted, as a rule, by identical reference symbols and that duplicate descriptions of identical members are omitted.

First Embodiment

Electronic Device Configuration Outline

Figure 1B:
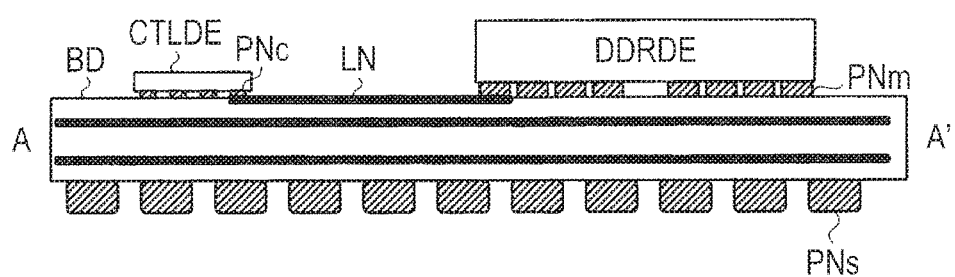
FIG. 1B is a sectional view schematically showing an example of a configuration along line A-A' in FIG. 1A.

FIG. 1A is a plan view schematically showing an example of an external configuration of an electronic device according to a first embodiment of the present invention. FIG. 1B is a sectional view schematically showing an example of a configuration along line A-A' in FIG. 1A. The electronic device shown in FIGS. 1A and 1B includes plural (four in the present example) memory devices (semiconductor devices) DDRDE1 to DDREDE4, a controller device (semiconductor device) CTLDE, and a wiring substrate BD over which the memory devices DDRDE1 to DDRDE4 and the controller device CTLDE are formed.

The memory devices DDRDE1 to DDRDE4 are each formed of a package, for example, a BGA (ball grid array) and each include plural external terminals PNm. The package includes, for example, an LPDDR4 memory chip (semiconductor chip). The external terminals PNm serve as external terminals of the memory chip. The controller device CTLDE is formed, for example, of a semiconductor chip provided with plural external terminals PNc. The semiconductor chip includes a circuit formed to access the memory devices DDRDE1 to DDRDE4.

The wiring substrate BD is also called, for example, an interposer substrate and includes plural wiring layers. External terminals PNc of the controller device CTLDE flip-chip bonded to the surface of the wiring substrate BD and external terminals PNm of the memory devices DDRDE1 to DDRDE4 mounted over the surface of the wiring substrate BD are coupled as required using lines LN formed in wiring layers of the wiring substrate BD. The wiring substrate BD is packaged including the memory devices DDRDE1 to DDRDE4 and the controller device CTLDE. On the reverse side of the wiring substrate BD, external terminals PNs of the package (e.g., BGA package) are provided.

As described above, the electronic device shown in FIGS. 1A and 1B is formed as a SiP (system in package) including plural semiconductor devices (or semiconductor chips). The external terminals PNs of the SiP are coupled to, for example, a mother board, not shown.

<Memory Device Configuration Outline>

Figure 2:
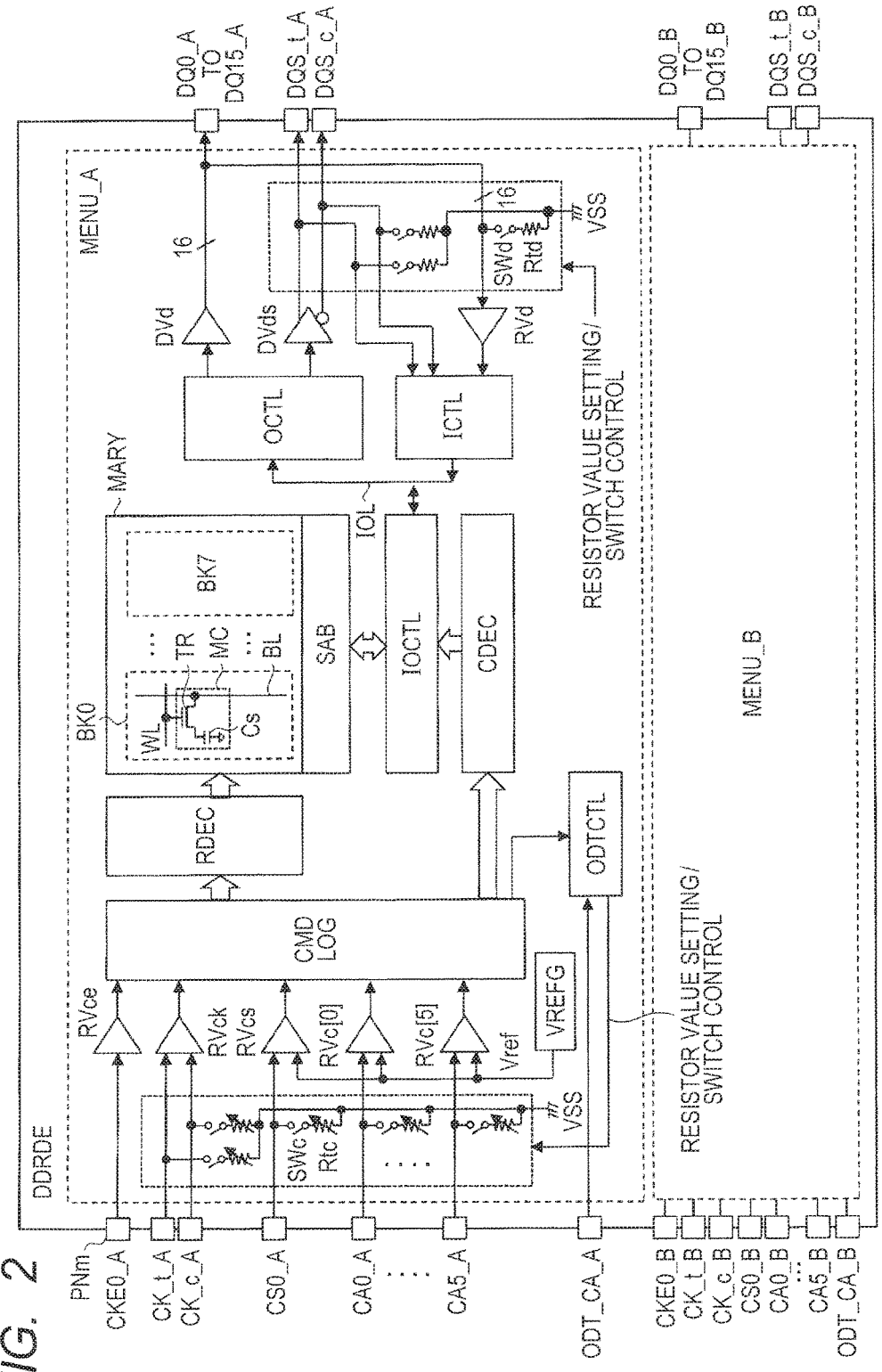
FIG. 2 is a circuit block diagram representing a main part of each memory device included in the electronic device shown in FIGS. 1A and 1B.

FIG. 2 is a circuit block diagram representing a main part of each memory device included in the electronic device shown in FIGS. 1A and 1B. To be specific, FIG. 2 shows a configuration example of the memory chip (making up a rank) included in each of the memory devices DDRDE1 to DDRDE4. The memory device DDRDE shown in FIG. 2 includes a memory unit MEMU_A making up channel A and a memory unit MEMU_B making up channel B.

The memory device DDRDE includes plural external terminals PNm. The external terminals PNm include those used as input terminals to input signals to the memory unit MEMU_A and others used as input/output terminals to input/output signals to/from the memory unit MEMU_A. The signals inputted to the memory unit MEMU_A via the external terminals PNm for input include signals CKE0_A, CK_t_A, CK_c_A, CS0_A, CA0_A to CA5_A, and ODT (On Die Termination)_CA_A. The signals inputted/outputted to/from the memory unit MEMU_A via the external terminals PNm for input/output include signals DQ0_A to DQ15_A, DQS_t_A, and DQS_c_A.

Note that, in the present specification, clock enable signals, for example, CKE0_A may also be collectively referred to as "CKE" signals. Also, clock signals, for example, CK_t_A/CK_c_A may also be collectively referred to as "CK" signals; chip select signals, for example, CS0_A may also be collectively referred to as "CS" signals; command address signals, for example, CA0_A to CA5_A may also be collectively referred to as "CA" signals; data signals, for example, DQ0_A to DQ15_A may also be collectively referred to as "DQ" signals; and data strobe signals, for example, DQS_t_A/DQS_c_A may also be collectively referred to as "DQS" signals.

Next, the internal configuration of the memory unit MEMU_A will be described. Receiver circuits RVce, RVcs, and RVc[0] to RVc[5] receive CKE0_A, CS0_A, and CA0_A to CA5_A signals, respectively. Receiver circuit RVck receives CK_t_A/CK_cA signals to generate a differential signal. Driver circuits DVd (totaling 16, though not shown) output DQ0_A to DQ15_A signals, respectively. Driver circuit DVds outputs DQS_t_A/DQS_c_A signals to generate a differential signal.

Memory array MARY includes, for example, eight memory banks BK0 to BK7. The memory banks BK0 to BK7 each include word lines WL, bit lines BL, and memory cells MC disposed at intersections of the word lines WL and bit lines BL. Each memory cell MC includes a memory cell transistor TR and a memory capacitor Cs. When the corresponding word line WL is activated in a write operation, the memory cell MC writes the data carried by the corresponding bit line BL to the memory capacitor Cs. When the corresponding word line WL is activated in a read operation, the memory cell MC reads out the data held by the memory capacitor Cs to the corresponding bit line BL.

Command logic circuit CMDLOG mainly receives, when the CKE0_A signal is enabled, the CS0_A and CA0_A to CA5_A signals from the receiver circuits RVcs and RVc[0] to RVc[5] in synchronization with the CK_t_A/CK_c_A signals. Based on the combination of the logic levels of the received signals, the command logic circuit CMDLOG interprets various commands (i.e., access commands to the memory array) such as write commands for writing to specified bank addresses and memory addresses and read commands for reading from specified bank addresses and memory addresses.

Row decoder circuit RDEC receives bank addresses and row addresses interpreted by the command logic circuit CMDLOG. When a bank address and a row address are received, the row decoder circuit RDEC activates the corresponding word line WL of the corresponding bank. Sense amplifier circuit SAB amplifies the data read out to the bit lines BL of the specified bank. When a column address interpreted by the command logic circuit CMDLOG is received, column decoder circuit CDEC outputs the corresponding selection signal. Input/output control circuit IOCTL determines the sense amplifier circuit SAB to be coupled to IO line IOL based on the selection signal received from the column decoder circuit CDEC.

Output control circuit OCTL outputs, in a read operation, the data carried by the IO line IOL via each driver circuit DVd at DDR (double data rate). At this time, the output control circuit also outputs DQS_t_A/DQS_c_A signals via the driver circuit DVds. Input control circuit ICTL collects, in a write operation, data received by each receiver circuit RVd at DDR and outputs the data to the IO line IOL. This is done in synchronization with the DQS_t_A/DQS_c_A signals received via external terminals PNm.

The LPDDR4 memory chip includes termination resistors (i.e. ODT (on-die termination)). The termination resistors are provided for the external terminals PNm for the DQ0_A to DQ15_A signals and DQS_t_A/DQS_c_A signals. The external terminal PNm for the DQ0_A signal, for example, is coupled to ground supply voltage VSS via switch SWd and termination resistor Rtd. Other external terminals PNm are also arranged similarly.

In the LPDDR4 memory chip, such terminal resistors are provided also for the external terminals PNm for commands and addresses, i.e., for the external terminals PNm for the CK_t_A/CK_c_A signals, CS0_A signal, and CA0_A to CA5_A signals. The external terminal PNm for the CS0_A signal, for example, is coupled to ground supply voltage VSS via switch SWc and termination resistor Rtc. Other external terminals PNm are also arranged similarly.

The resistance value of the termination resistor Rtd can be set to be common to plural external terminals PNm, for example, by mode register setting at the time of powering up the memory device DDRDE. The switch SWd is dynamically turned on/off depending on the write/read operation. The termination resistors Rtc can also be set to a common value, different from that of the termination resistor Rtd, for plural external terminals PNm, for example, by mode register setting at the time of powering up the memory device DDRDE. In the example shown in FIG. 2, ODT control circuit ODTCTL determines the resistance value of each termination resistor Rtc based on mode register setting made via the command logic circuit CMDLOG. The common resistance value of the termination resistors Rtc is selected, for example, out of 240Ω, 120Ω, 80Ω, 60Ω, 48Ω, and 40Ω.

Furthermore, the ODT control circuit ODTCTL controls switching on/off of each switch SWc based on the logic level of an ODT_CA_A signal. The ODT_CA_A signal is fixed, for example, at '1' level or '0' level. When the ODT_CA_A signal is fixed at '1' level, each switch SWc is generally kept on. To be more precise, however, the ODT control circuit ODTCTL controls switching on/off of each switch SWc based on the combination of mode register setting and the logic level of the ODT_CA_A signal.

Also, as shown in FIG. 2, the LPDDR4 memory chip includes an internal reference voltage generation circuit VREFG. The internal reference voltage generation circuit VREFG supplies a common reference voltage Vref to the receiver circuits RVcs and RVc[0] to RVc[5]. The reference voltage Vref is adjustable and can be set to an optimum value, during a training period when powering up the memory device DDRDE, through plural times of communication between the memory device DDRDE and the controller device CTLDE.

The memory unit MEMU_B is configured similarly to the memory unit MEMU_A described above. Briefly describing the memory unit MEMU_B, the memory device DDRDE includes plural external terminals PNm. The external terminals PNm include those used as input terminals to input signals to the memory unit MEMU_B and others used as input/output terminals to input/output signals to/from the memory unit MEMU_B. The signals inputted to the memory unit MEMU_B via the external terminals PNm for input include signals CKE0_B, CK_t_B, CK_c_B, CS0_B, CA0_B to CA5_B, and ODT_CA_B. The signals inputted/outputted to/from the memory unit MEMU_B via the external terminals PNm for input/output include signals DQ0_B to DQ15_B, DQS_t_B, and DQS_c_B.

The memory unit MEMU_B like the foregoing memory unit MEMU_A includes, in addition to a memory array MARY with various peripheral circuits, various internal circuits similar to those included in the memory unit MEMU_A. In the memory unit MEMU_B, the external terminals PNm for such signals as CKE0_B, CK_t_B/CK_c_B, CS0_B, and CA0_B to CA5_B are used to input commands for accessing the memory array MARY of the memory unit MEMU_B. As described in the foregoing, the external terminals PNm for such signals as CKE0_A, CK_t_A/CK_c_A, CS0_A, and CA0_A to CA5_A are used to input commands for accessing the memory array MARY of the memory unit MEMU_A.

FIG. 3 is a plan view schematically showing a layout of the external terminals included in the memory device shown in FIG. 2. The layout of the external terminals is determined based on the LPDDR4 standard. Referring to FIG. 3, the external terminals PNm corresponding to the memory unit MEMU_A are provided in an upper half region and the external terminals PNm corresponding to the memory unit MEMU_B are provided in a lower half region. For example, the external terminal PNm for the CA0_A signal is provided in the row H part of the 2nd column, and the external terminal PNm for the CA0_B signal is provided in the row R part of the 2nd column. Similarly, the external terminal PNm for the CA1_A signal is provided in the row J part of the 2nd column, and the external terminal PNm for the CA1_B signal is provided in the row P part of the 2nd column.

In this manner, the external terminals PNm for the memory unit MEMU_A provided in the upper half region and the external terminals PNm for the memory unit MEMU_B provided in the lower half region are generally symmetrical with respect to a border between them (a border between rows L and M, neither shown). Note that the external terminal PNm for a reset signal RESET_n is for common use between the channels and is provided only in the row T part of the 11th column. The DQS signals are provided on a one-per-byte basis, for example, like DQS0_t_A and DQS1_t_A signals.

Also, the external terminals PNm for the CS1_A and CS1_B signals provided in the 3rd column and the external terminals PNm for the CKE1_A and CKE1_B signals provided in the 5th column are used to configure rank 2. Namely, in reality, the memory device DDRDE as shown in FIG. 2 has, in many cases, a two-rank configuration including two memory chips. In such cases the CS1_A, CS1_B, CKE1_A, and CKE1_B signals are used for the memory chip corresponding to rank 2, and the other signals are used commonly for ranks 1 and 2.

In FIG. 3, there are blank parts (for example, row K part of the 1st column) without any indication. In reality, various external terminals PNm, for example, for supply voltages (VDD1, VDD2, VDDQ), for ground supply voltage VSS, and for a DMI (data mask inversion) signal, and also external terminals PNm for configuring ranks 3 and 4 are provided in such parts.

<Controller Device Configuration Outline>

Figure 4:
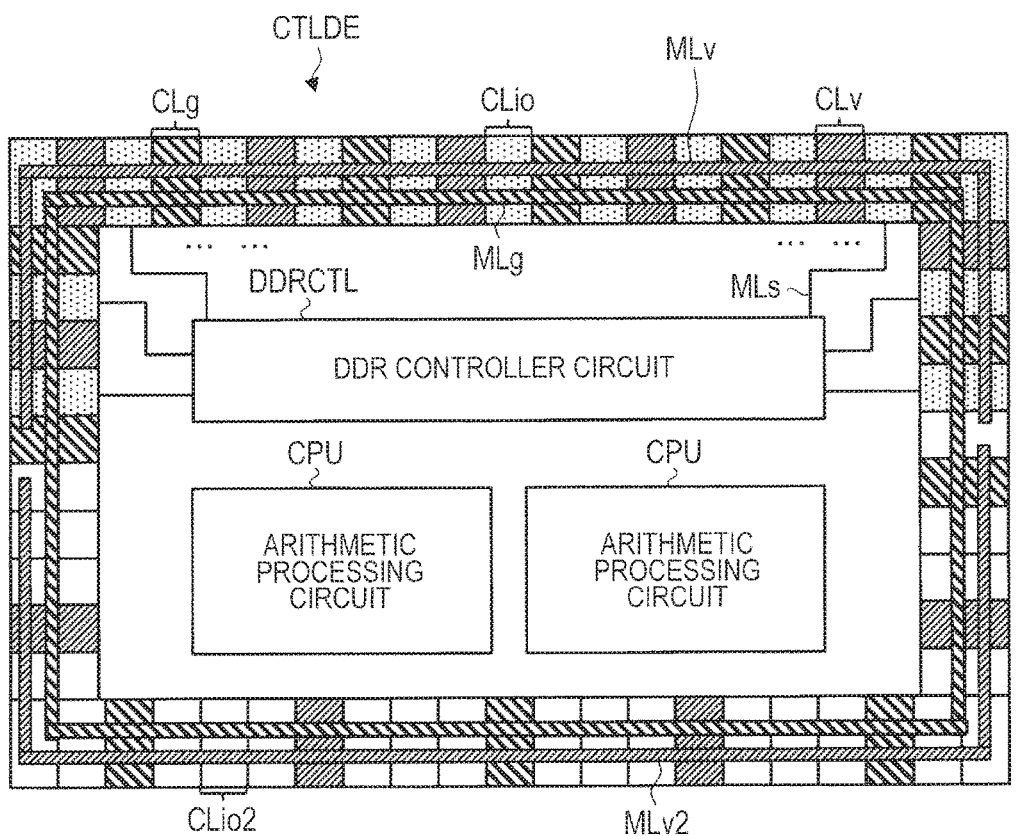
FIG. 4 is a plan view schematically showing a layout of a main part of a controller device included in the electronic device shown in FIGS. 1A and 1B.

FIG. 4 is a plan view schematically showing a layout of a main part of the controller device included in the electronic device shown in FIGS. 1A and 1B. The controller device CTLDE shown in FIG. 4 is, as mentioned in the foregoing, configured in one semiconductor chip and includes, for example, plural cells disposed in peripheral parts of the chip and also a DDR controller circuit DDRCTL and plural arithmetic processing circuits CPU disposed in inner parts of the chip. The cells include IO cells CLio for DDR signals, power supply cells CLv, grounding cells CLg, and IO cells CLio2 for other signals.

The IO cells CLio for DDR signals are coupled to the DDR controller circuit DDRCTL via signal lines (e.g. metal lines) MLs for DDR signals. The IO cells CLio for DDR signals are also coupled to external terminals PNc shown in FIG. 1B to be further coupled, via lines LN formed on the wiring substrate BD, to external terminals PNm for plural memory devices DDRDE. This allows the DDR controller circuit DDRCTL to send required signals (e.g., CA signals) to the memory device DDRDE or to receive signals (e.g., DQ signals) outputted from the memory device DDRDE or to send and receive such signals via the IO cells for DDR signals.

The cells CLv for power supply and the cells CLg for grounding are used to supply power supply voltages and ground supply voltage to the corresponding IO cells. The cells CLv for power supply and the cells CLg for grounding each include, for example, a circuit element for power supply stabilization and an ESD protection element. The cells CLg for grounding are mutually coupled via a grounding line (e.g., a metal line) MLg formed like a ring in a peripheral part of the chip.

The cells CLv for power supply include those for supplying supply voltages to IO cells CLio for DDR signals and others for supplying supply voltages to the IO cells CLio2 for other signals. The power supply cells for DDR-related use are mutually coupled via a power supply line (e.g., a metal line) MLv for DDR-related use formed in a peripheral part of the chip. Similarly, the power supply cells for other uses are mutually coupled via a power supply line MLv2 for other internal power supplies in the chip. The power supply line MLv2 for other uses is formed in another peripheral part of the chip.

The controller device CTLDE is configured as an SoC (system on a chip) including, for example, an arithmetic processing circuit CPU coupled with various circuit blocks via a bus. The DDR controller circuit DDRCTL is among the various circuit blocks. The arithmetic processing circuit CPU performs required arithmetic processing by accessing plural memory devices DDRDE shown in FIG. 1A via the DDR controller circuit DDRCTL and IO cells Clio for DDR signals. At this time, the DDR controller circuit DDRCTL controls access to the memory devices DDRDE while converting commands received from the arithmetic processing circuit CPU to commands based on LPDDR4.

In FIG. 4, only a small portion of the IO cells CLio for DDR signals are shown. In reality, many more IO cells CLio for DDR signals are provided as seen from FIGS. 1A and 2. Similarly, only a small portion of the IO cells CLio2 for other signals are shown in FIG. 4. The IO cells CLio2 for other signals are coupled as required to various circuit blocks (not shown) other than the DDR controller circuit DDRCTL. Some IO cells CLio2 for other signals are coupled to external terminals PNc shown in FIG. 1B to be further coupled to external terminals PNs via lines LN formed on the wiring substrate BD.

The various circuit blocks (not shown) mentioned above include, but not limited to, circuit blocks to support serial communication functions and circuit blocks to control audio/video output. Such circuit blocks communicate with the mother board via the IO cells CLio2 for other signals and external terminals PNs. The controller device CTLDE is not limited to an SoC like the one described above. It may have an alternative configuration including, at least, the DDR controller circuit DDRCTL and IO cells CLio for DDR signals.

<Problems with Electronic Device>

As shown, for example, in FIG. 2, in an LPDDR4 memory chip unlike in an LPDDR3 memory chip, the input terminals (external terminals) PNm for control signals (e.g., CA signals) include terminals for channel A (e.g., for the CA0_A signal) and terminals for channel B (e.g. for the CA0_B signal). Therefore, in most cases, the IO cells CLio for DDR signals shown in FIG. 4 (and also external terminals PNc coupled to the IO cells) also include two groups for two channels.

This increases the number of the IO cells CLio for DDR signals and the number of external terminals PNc coupled thereto. Particularly, as shown in FIG. 1A, in cases where plural memory devices DDRDE are to be controlled, it is necessary to provide each memory device with the IO cells CLio for DDR signals for two channels. This more remarkably increases the numbers of the above cells and terminals.

Furthermore, when the number of the IO cells CLio for DDR signals increases, the numbers of the cells CLv for power supply and cells CLg for grounding both shown in FIG. 4 also increase. Generally, a cell CLv for power supply and a cell CLg for grounding are provided for every n IO cells. The value of n is smaller when the relevant IO cells are higher in operating speed. According to the LPDDR4 standard, high-speed CK signals of 800 MHz to 1600 MHz are used, so that the value of n is small (in the example shown in FIG. 4, n=1). Hence, when the number of the IO cells CLio for DDR signals increases, the numbers of the cells CLv for power supply and cells CLg for grounding can drastically increase.

Consequently, the size of the controller device CTLDE (i.e. semiconductor chip) possibly increases involving a cost increase. The power consumption of the controller device CTLDE may also increase. Furthermore, the lines LN formed on the wiring substrate BD may become more complicated. In addressing these problems, using the method being described in the following will be beneficial.

<Internal Couplings of Electronic Device>

Figure 5:
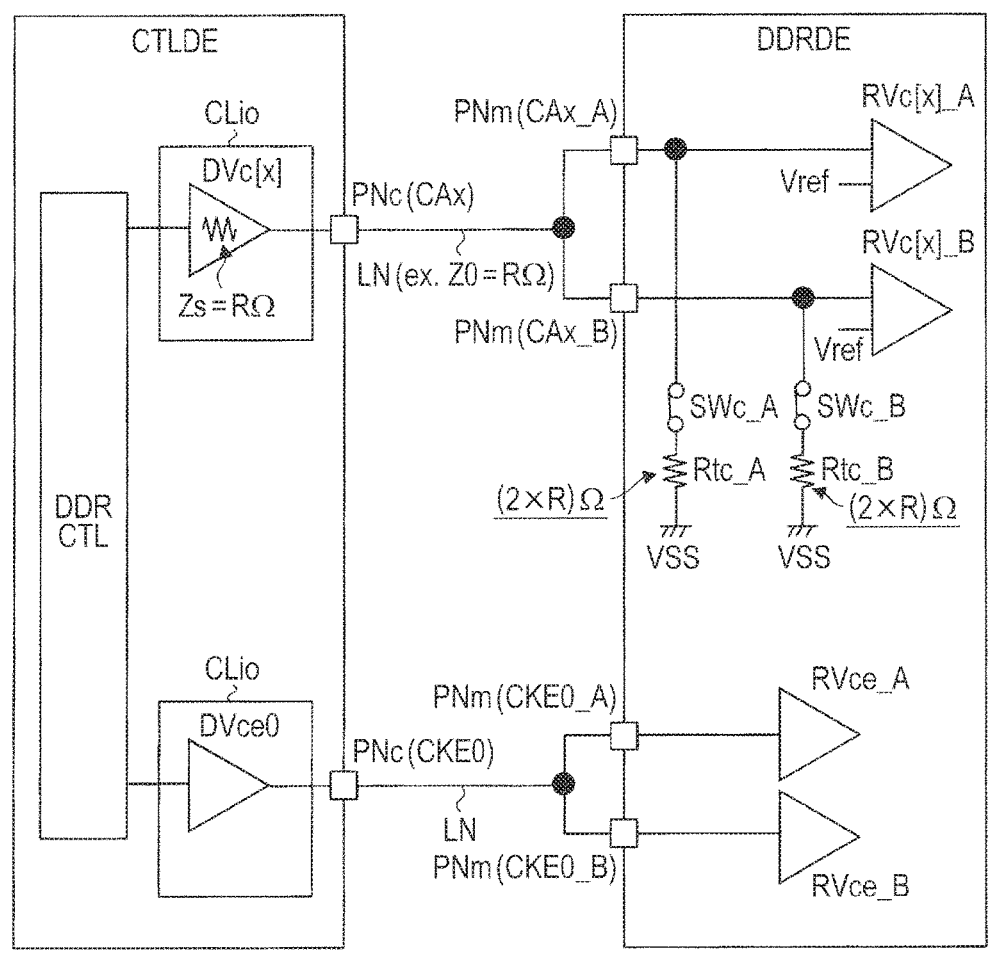
FIG. 5 is a schematic diagram showing example main couplings between the controller device and a memory device included in the electronic device shown in FIG. 1.

FIG. 5 is a schematic diagram showing example main couplings between the controller device and a memory device included in the electronic device shown in FIG. 1. In the present embodiment, as shown in FIG. 5, the CA and CKE signal output terminals of the controller device CTLDE are coupled to the CA and CKE signal input terminals of the memory device DDRDE in a 1-to-2 format. That is, a CA signal output terminal of the controller device CTLDE is coupled to two CA signal input terminals for the two channels of the memory device DDRDE. Similarly, a CKE signal output terminal of the controller device CTLDE is coupled to two CKE signal input terminals for the two channels of the memory device DDRDE.

To be specific, the controller device CTLDE includes an external terminal (output terminal) PNc (CAx) to output a CAx signal common to both channels A and B and an IO cell CLio for a DDR signal coupled to the external terminal PNc. The IO cell CLio for a DDR signal includes a driver circuit DVc[x] to drive the external terminal PNc (CAx). The memory device DDRDE, on the other hand, includes an external terminal (input terminal) PNm (CAx_A) for a CAx_A signal, an external terminal (input terminal) PNm (CAx_B) for a CAx_B signal, and receiver circuits RVc[x]

_A and RVc[x]_B to receive the signals inputted to the external terminals PNm (CAx_A) and PNm (CAx_B), respectively.

The external terminals PNm (CAx_A) and PNm (CAx_B) are commonly coupled to the external terminal PNc (CAx) via line LN formed on the wiring substrate BD shown in FIGS. 1A and 1B. Symbol "x" included in, for example, "CAx" shown in FIG. 5 represents a value ranging from 0 to 5 corresponding to six CA signals (CA0 to CA5 signals) for each of channels A and B. Namely, the circuit configuration shown in FIG. 5, in reality, includes six sets of driver circuits DVc[x] and external terminals PNc (CAx) and also six sets of external terminals PNm (CAx_A) and PNm (CAx_B) and receiver circuits RVc[x]_A and RVc[x]_B.

For example, in the case of x=0, driver circuit DVc[0] outputs a CA0 signal to external terminal PNc (CA0). The CA0 signal is inputted as CA0_A and CA0_B signals, shown in FIG. 2, to external terminals PNm (CA0_A) and PNm (CA0_B). Receiver circuits RVc[0]_A and RVc[0]_B receive the CA0_A and CA0_B signals, respectively. The receiver circuit RVc[0]_A corresponds to the receiver circuit RVc[O] included in the memory unit MEMU_A shown in FIG. 2. The receiver circuit RVc[0]_B corresponds to the receiver circuit RVc[0] (not shown) included in the memory unit MEMU_B shown in FIG. 2.

By coupling, as described above, the two external terminals PNm (CAx_A) and PNm (CAx_B) of the memory device DDRDE commonly to the external terminal PNc (CAx) of the controller device CTLDE, the number of terminals and the number of the IO cells CLio for DDR signals included in the controller device CTLDE can be reduced. Simply coupling the two terminals commonly to the controller device CTLDE, however, may not secure required waveform quality. In this respect, according to the present embodiment, the termination resistors described with reference to FIG. 2 in the foregoing are set such that required waveform quality can be secured.

As shown in FIG. 5, drive impedance Zs of the driver circuit DVc[x] in the controller device CTLDE is designed to be R Ω. Characteristic impedance Z0 of line (transmission line) LN is also set to R Ω to match the drive impedance of the driver circuit. Termination resistor Rtc_A is coupled, via switch SWc_A, to external terminal PNm (CAx_A) of the memory device DDRDE to terminate the external terminal. Similarly, termination resistor Rtc B is coupled, via switch SWc_B, to external terminal PNm (CAx_B) to terminate the external terminal. The switch SWc_A and termination resistor Rtc_A respectively correspond to the switch SWc and termination resistor Rtc included in the memory unit MEMU_A shown in FIG. 2. The switch SWc_B and termination resistor Rtc_B respectively correspond to the switch SWc and termination resistor Rtc (not shown) included in the memory unit MEMU_B.

The composite resistance value of termination resistors Rtc_A and Rtc_B is set such that the composite resistance value is equivalent to the drive impedance (R Ω) of the driver circuit DVc[x]. Alternatively, the composite resistance value is determined so as to match the characteristic impedance (e.g., R Ω) of line LN. In the LPDDR4 memory chip, the resistance values of termination resistors Rtc_A and Rtc_B are set to equal each other. In the present example, they are both set to (2×R)Ω. Though not necessarily defined, R Ω equals 40Ω. Hence, the termination resistors Rtc_A and Rtc_B are both set to 80Ω. When R Ω equals 40Ω, it is relatively easy to design a chip and a substrate taking electric characteristics of various signals into consideration.

The ODT control circuit ODTCTL shown in FIG. 2 sets the termination resistors Rtc_A and Rtc_B to, for example, 80Ω according to the mode register setting inputted from the controller device CTLDE via an external terminal PNm. Also, by coupling, for example, the external terminals PNm for the ODT_CA_A and ODT_CA_B signals shown in FIG. 2 to a supply voltage, the ODT control circuit ODTCTL turns switches SWc_A and SWc_B both on.

In the above circuit configuration, the external terminals PNm (CAx_A) and PNm (CAx_B) are each coupled with a termination resistor having an equivalent composite resistance of R Ω. This makes it possible to inhibit waveform reflection and adequately secure waveform quality. The drive impedance of the driver circuit DVc[x], the characteristic impedance of line LN, and the composite resistance value of the termination resistors Rtc_A and Rtc_B are ideally all R Ω as shown in FIG. 5, but their values are not necessarily limited to R Ω.

Namely, in reality, the driver circuit DVc[x] is subjected to chip designing limitations related with driving capability. The wiring substrate BD, too, is subjected to substrate designing limitations related with, for example, wiring pattern layout and line widths. In such cases, the drive impedance of the driver circuit DVc[x] and the characteristic impedance of line LN cannot necessarily be designed to be R Ω. Therefore, the composite resistance value of the termination resistors Rtc_A and Rtc_B need not necessarily be identical with the drive impedance of the driver circuit DVc[x] and the characteristic impedance of line LN, but is required to be equivalent to such impedance values. In other words, the composite resistance value of the termination resistors Rtc_A and Rtc_B is required to be determined such that impedance matching is substantially achieved.

To be specific, when, for example, the composite resistance value of the termination resistors Rtc_A and Rtc_B has an error of ±25% relative to the characteristic impedance of line LN, wave reflections at the external terminals PNm (CAx_A) and PNm (CAx_B) will range only 10% to 15% with respect to the incident waves.

Therefore, when the composite resistance value of the terminal resistors Rtc_A and Rtc_B corresponds to the drive impedance of the driver circuit DVc[x] (or the characteristic impedance of line LN) plus or minus, for example, 25% or so, it may be regarded as equivalent to the impedance. More preferably, the composite resistance value corresponds to the drive impedance of the driver circuit DVc[x] (or the characteristic impedance of line LN) plus or minus, for example, 15% or so. In this case, wave reflection is about 7% of the incident waves.

Also, as shown in FIG. 5, the controller device CTLDE includes the external terminal PNc (CKE0) to output a CKE0 signal commonly for channels A and B and the IO cell CLio for a DDR signal coupled to the external terminal PNc (CKE0). The IO cell CLio for a DDR signal includes a driver circuit DVce0 to drive the external terminal PNc (CKE0). The memory device DDRDE further includes the external terminals PNm (CKE0_A) and PNm (CKE0_B) respectively for the CKE0_A and CKE0_B signals shown in FIG. 2 and receiver circuits RVce_A and RVce_B to receive the signals inputted to the external terminals PNm (CKE0_A) and PNm (CKE0_B).

The external terminals PNm (CKE0_A) and PNm (CKE0_B) are commonly coupled to the external terminal PNc (CKE0) via line LN formed on the wiring substrate BD shown in FIGS. 1A and 1B. The receiver circuit RVce_A corresponds to the receiver circuit RVce included in the memory unit MEMU_A shown in FIG. 2. The receiver circuit RVce_B corresponds to the receiver circuit RVce (not shown) included in the memory unit MEMU_B shown in FIG. 2. This configuration can further reduce the numbers of terminals and IO cells CLio for DDR signals included in the controller device CTLDE. For the CKE signals, there is not any particular waveform quality requirement, so that the external terminals PNm (CKE0_A) and PNm (CKE0_B) can be simply coupled to the external terminal PNc (CKE0) in a 1-to-2 format.

Main Effects of First Embodiment

Using the electronic device of the above-described first embodiment typically makes it possible to reduce the number of terminals included in a semiconductor device (i.e., controller device CTLDE) which is included in the electronic device. To be specific, in the example case shown in FIGS. 1A and 2, the number of external terminals PNc included in the controller device CTLDE can be reduced by seven per memory device DDRDE, that is, by six in connection with the CA signals and by one in connection with the CKE signals. Therefore, for a total of four memory devices DDRDE, the number of external terminals PNc included in the controller device CTLDE can be reduced by 28.

This consequently makes it possible, as described in the foregoing, to reduce, in addition to the number of external terminals PNc, the numbers of the IO cells CLio for DDR signals, cells CLv for power supply and cells CLg for grounding, so that the chip size and cost can also be reduced. Furthermore, it also becomes possible to reduce the power consumption of the controller device CTLDE and to simplify the layout of lines LN formed on the wiring substrate BD. These advantageous effects can be achieved while adequately securing the waveform quality of the CA signals.

The first embodiment has been described based on an example case in which each memory device DDRDE includes a single-rank memory chip (i.e., a single memory chip) only. In cases where each memory device DDRDE includes memory chips of two ranks (i.e., two memory chips), one of the memory chips is to have termination resistors set as shown in FIG. 5 and the other one of the memory chips is to be set by means of mode register setting so as not to be coupled to any termination resistor.

Second Embodiment

Configuration of Main Part of Wiring Substrate

Figure 6:
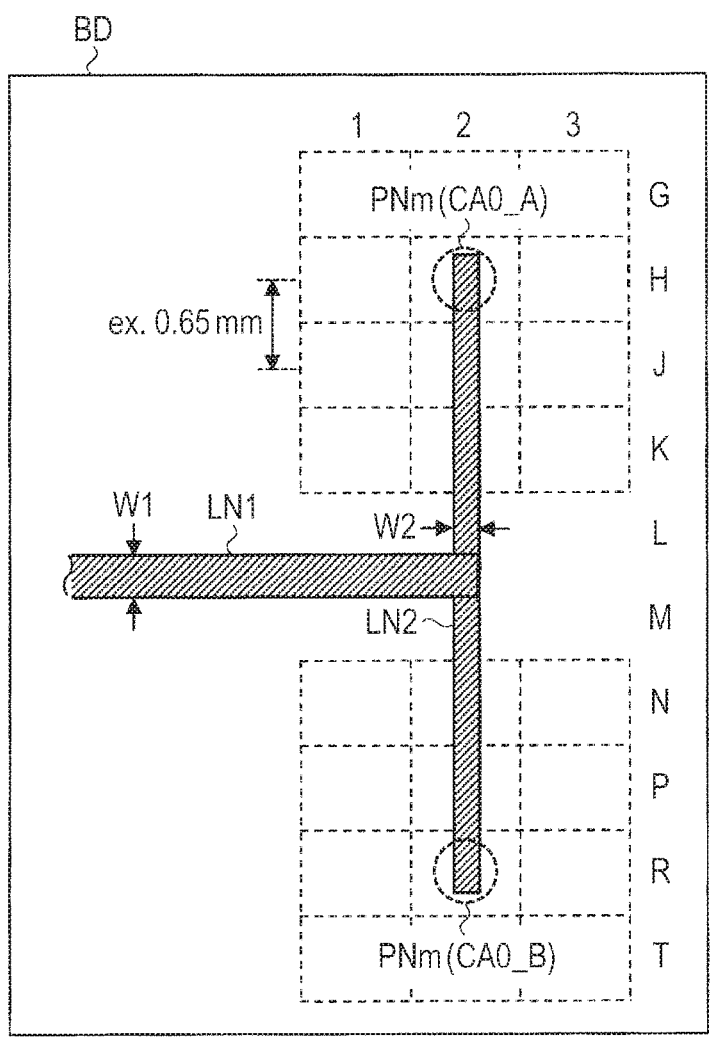
FIG. 6 is a plan view schematically showing a layout of a main part of a wiring substrate included in an electronic device according to a second embodiment of the present invention.

FIG. 6 is a plan view schematically showing a layout of a main part of a wiring substrate included in an electronic device according to a second embodiment of the present invention. In FIG. 6, the layout around external terminals PNm (CA0_A) and (CA0_B) described in connection with the first embodiment are shown as a typical layout example. As shown in FIG. 5, the external terminals PNm (CA0_A) and (CA0_B) are commonly coupled to external terminal PNc (CA0) via line LN formed on the wiring substrate BD.

The line LN is formed in a T-branch topology in which, as shown in FIG. 6, line LN1 extending from the external terminal (output terminal) PNc (CA0) is branched into two branches, one extending for coupling with the external terminal (input terminal) PNm (CA0_A) and the other extending for coupling with the external terminal (input terminal) PNm (CA0_B). The characteristic impedance of line LN2 after branching is larger than the characteristic impedance of line LN1 before branching. To be specific, line width W2 of line LN2 after branching is smaller than the line width W1 of line LN1 before branching.

The above T-branch topology has been described in connection with the CA0_A/CA0_B signals, but the same also applies to other CA signals (i.e., CA1_A/CA1_B to CA5_A/CA5_B signals). As for the CKE signals, lines need not be laid out as shown in FIG. 6. For example, a T-branch topology with a uniform line width or a different line topology may be used.

Figure 7A:
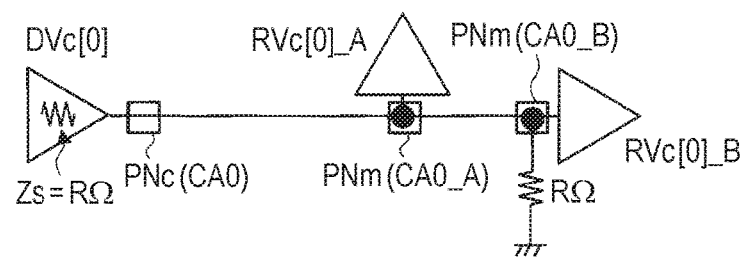
FIG. 7A is a schematic diagram showing a line topology studied as an example for comparison with FIGS. 5 and 6.
Figure 7B:
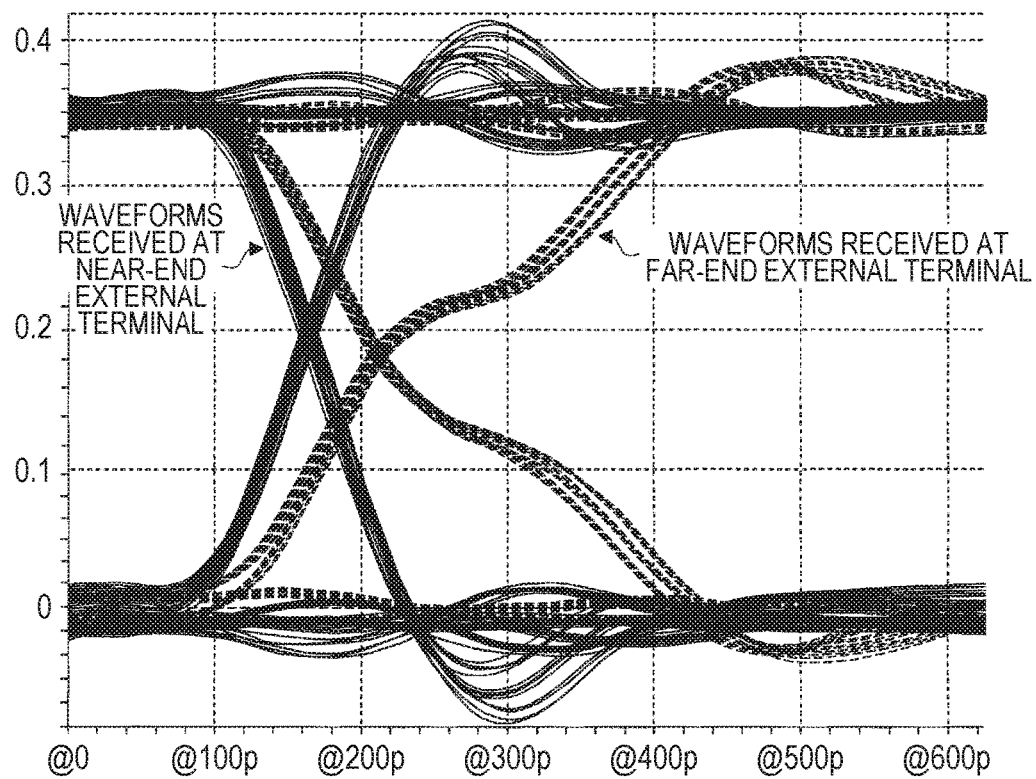
FIG. 7B shows example waveforms observed in assessing the line topology shown in FIG. 7A as an example for comparison.

As a first example for comparison with the line topology shown in FIG. 6, a line topology as shown in FIG. 7A will be described below. FIG. 7A is a schematic diagram showing the line topology studied as an example for comparison with FIGS. 5 and 6. FIG. 7B shows example waveforms observed in assessing the line topology shown in FIG. 7A as an example for comparison. The line topology shown in FIG. 7A is called a fly-by topology. In the fly-by topology shown in FIG. 7A, the line extending from the external terminal PNc (CA0) is coupled to the external terminal PNm (CA0_B) via the external terminal PNm (CA0_A).

When the fly-by topology shown in FIG. 7A is used, unlike in the first embodiment, the external terminal PNm (CA0_B) is coupled with a termination resistor of R Ω whereas the external terminal PNm (CA0_A) is coupled with no termination resistor. When the fly-by topology as described above is used, however, there can be cases in which, as shown in FIG. 7B, satisfactory waveform quality cannot be secured at the external terminal PNm (CA0_B), i.e. the far-end external terminal. This is possibly because of the influence of internal wiring, for example, between the external terminal PN (CA0_A) and the receiver circuit RVc[0]_A.

Figure 8:
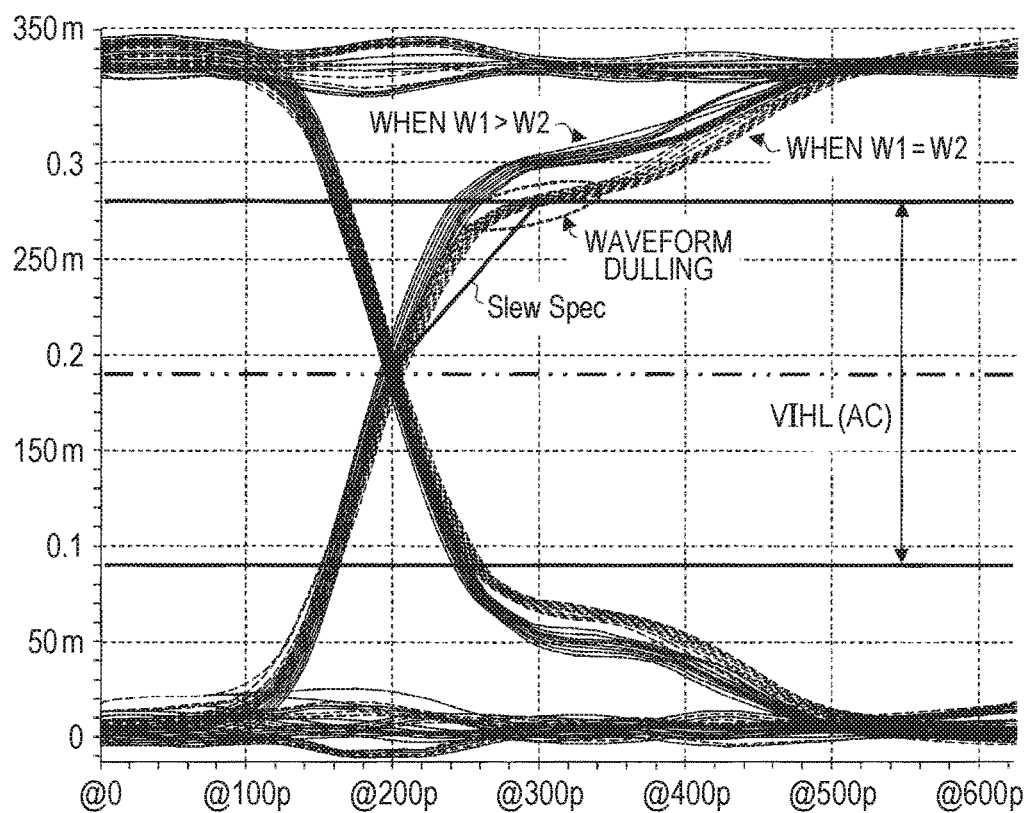
FIG. 8 is a waveform diagram obtained in assessing the line topology shown in FIG. 6.

In the second embodiment of the present invention, a T-branch topology is used in which two external terminals are terminated by their composite resistance as described in connection with the first embodiment. FIG. 8 is a waveform diagram obtained in assessing the line topology shown in FIG. 6. The waveforms shown in FIG. 8 also include waveforms observed in a case where line width W1 of line LN1 equals line width W2 of line LN2 as second waveform examples for topology comparison based on FIG. 6. As shown in FIG. 8, when line width W1 equals line width W2, it is feared that satisfactory waveform quality cannot be secured.

In concrete terms, the LPDDR4 standard includes specification on waveform inclination (slew specification) and it is feared that, with line width W1 equaling line width W2, the specification cannot be met. It is for this reason that line width W1 is made larger than line width W2 in the second embodiment. In this way, satisfactory waveform quality can be secured as shown in FIG. 8.

Figure 9:
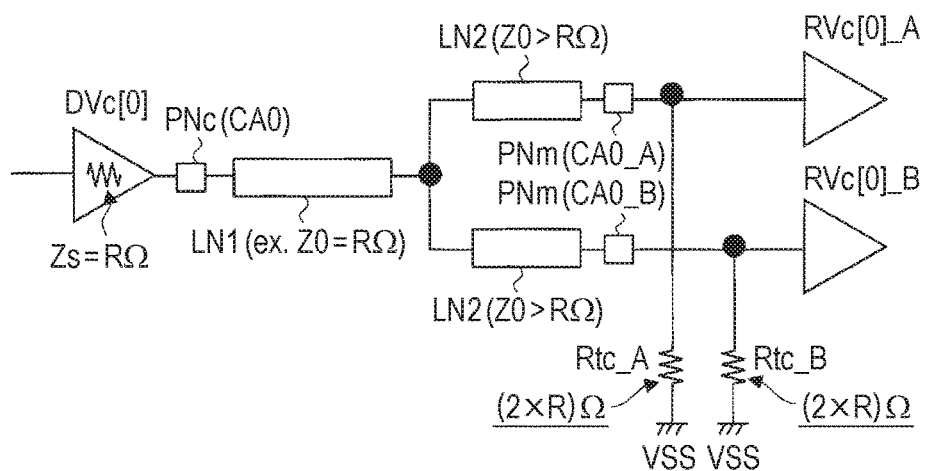
FIG. 9 is a schematic diagram showing a configuration example of an equivalent circuit corresponding to FIG. 6.

FIG. 9 is a schematic diagram showing a configuration example of an equivalent circuit corresponding to FIG. 6. As shown in FIG. 6, there is a certain distance between the branch point between line LN1 and line LN2 and each of the external terminals PNm (CA0_A) and PNm (CA0_B) positioned as shown in FIG. 3 showing the terminal layout in the package. With the terminals arranged with a pitch of 0.65 mm in the column direction, the distance, for example, between the branch point and the external terminal PNm (CA0_A) exceeds 2 mm. Because of this distance, line LN2 between the branch point and each of the external terminals PNm (CA0_A) and PNm (CA0_B) bears a transmission line characteristic and, depending on the case, an impedance mismatch is caused between lines LN1 and LN2.

As shown in FIG. 9, characteristic impedance Z0 of line LN2 is larger than R Ω. In an ideal case with Z0 equaling (2×R) Ω, impedance matches, in principle, between line LN1 and line LN2 branching from LN1. To achieve this, line width W1 is to be larger than line width W2 as shown in FIG. 6. In reality, due to restrictions imposed in designing a substrate, the line widths cannot be made smaller than a minimum allowable line width, so that line width W2 cannot always be set to realize a characteristic impedance of (2×R) Ω. Hence, for practical purposes, line width W2 is to be set to realize a characteristic impedance as close to (2×R) Ω as possible.

As described above, the electronic device of the second embodiment further improves waveform quality while also realizing various advantageous effects described in connection with the first embodiment.

Third Embodiment

Internal Couplings of Electronic Device

Figure 10:
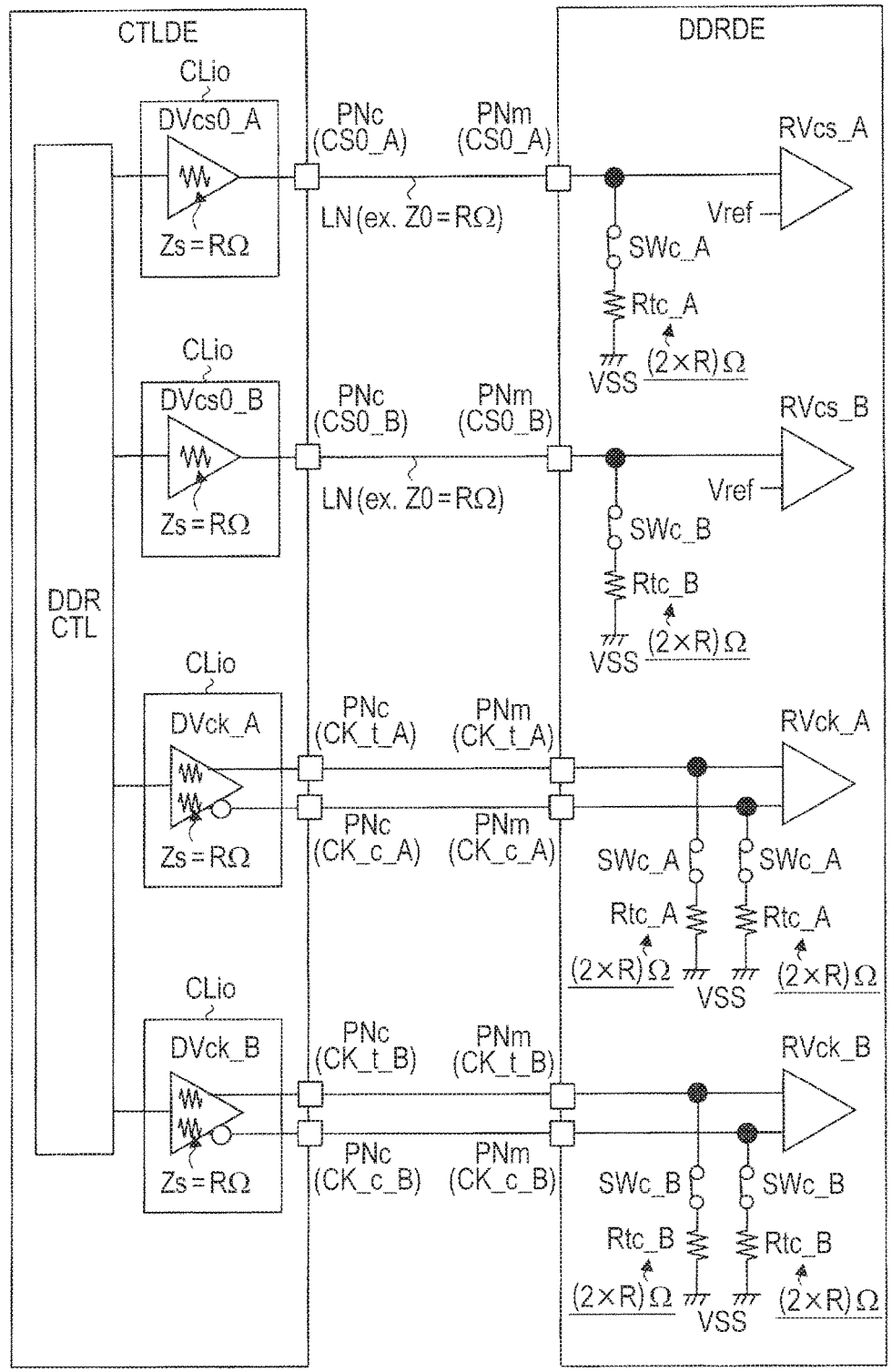
FIG. 10 is a schematic diagram showing example main couplings between the controller device and a memory device shown in FIG. 1 and included in an electronic device according to a third embodiment of the present invention.

FIG. 10 is a schematic diagram showing example main couplings between the controller device and a memory device shown in FIG. 1 and included in an electronic device according to a third embodiment of the present invention. Whereas, as shown in FIG. 5, the CA signals and CKE signals are coupled between the controller device and the memory device (of two channels) in a 1-to-2 format, the CS and CK signals are coupled in a 1-to-1 format as shown in FIG. 10.

The controller device CTLDE shown in FIG. 10 includes an external terminal (output terminal) PNc (CS0_A) to output the CS0_A signal shown in FIG. 2 and the IO cell CLio for a DDR signal coupled to the external terminal PNc (CS0_A). The IO cell CLio for a DDR signal has a driver circuit DVcs0_A to drive the external terminal PNc (CS0_A). The control device CTLDE also includes an external terminal (output terminal) PNc (CS0_B) to output the CS0_B signal shown in FIG. 2 and the IO cell CLio for a DDR signal including a driver circuit DVcs0_B.

The memory device DDRDE includes an external terminal (input terminal) PNm (CS0_A) for the CS0_A signal and a receiver circuit RVcs A to receive the CS0_A signal inputted to the external terminal. The memory device DDRDE also includes an external terminal (input terminal) PNm (CS0_B) for the CS0_B signal and a receiver circuit RVcs B. The receiver circuit RVcs A corresponds to the receiver circuit RVcs included in the memory unit MEMU_A shown in FIG. 2. The receiver circuit RVcs B corresponds to the receiver circuit RVcs (not shown) included in the memory unit MEMU_B shown in FIG. 2.

The external terminal (input terminal) PNm (CS0_A) is coupled to the external terminal (output terminal) PNc (CS0_A) via line LN formed on the wiring substrate BD shown in FIGS. 1A and 1B. The external terminal (input terminal) PNm (CS0_B) is coupled to the external terminal (output terminal) PNc (CS0_B) via line LN formed on the wiring substrate BD. The external terminal PNm (CS0_A) is coupled, via switch SWc_A, with a termination resistor Rtc_A for terminating the external terminal PNm (CS0_A). The external terminal PNm (CS0_B) is coupled, via switch SWc_B, with a termination resistor Rtc_B for terminating the external terminal PNm (CS0_B).

In the LPDDR4 memory chip, as described with reference to FIG. 2, the termination resistors for various control signals (CK, CS, and CA signals) are set to a common resistance value. Therefore, the resistance values of the termination resistors Rtc_A and Rtc_B for the CS signals equal the resistance values (i.e., (2×R) S each) of the termination resistors Rtc_A and Rtc_B for the CA signals shown in FIG. 5. Also, the drive impedance of each of the driver circuits DVcs0_A and DVcs0_B is normally equivalent to the drive impedance (i.e. R Ω) of the driver circuit DVc[x] shown in FIG. 5 with the respective driver circuits formed in the IO cells CLio for DDR signals included in the same semiconductor chip.

The controller device CTLDE includes external terminals PNc (CK_t_A) and PNc (CK_c_A) to output the CK_t_A/CK_c_A signals shown in FIG. 2 and the IO cell CLio for DDR signals coupled to the external terminals. The IO cell CLio for DDR signals includes a differential driver circuit DVck_A to differentially drive the external terminals PNc (CK_t_A) and PNc (CK_c_A). The controller device CTLDE also includes external terminals PNc (CK_t_B) and PNc (CK_c_B) to output the CK_t_B/CK_c_B signals shown in FIG. 2 and an IO cell CLio for DDR signals. The IO cell CLio for DDR signals includes a differential driver circuit DVck_B.

The memory device DDRDE includes external terminals PNm (CK_t_A) and PNm (CK_c_A) for the CK_t_A/CK_c_A signals and a differential receiver circuit RVck_A to receive the differential signals inputted to the external terminals. The memory device DDRDE also includes external terminals PNm (CK_t_B) and PNm (CK_c_B) for the CK_t_B/CK_c_B signals and a differential receiver circuit RVck B. The external terminals PNm (CK_t_A) and PNm (CK_c_A) are each coupled to a termination resistor Rtc_A via a switch Swc_A. The external terminals PNm (CK_t_B) and PNm (CI_c_B) are each coupled to a termination resistor Rtc V via a switch SWc_B.

For the CK signals, couplings in a 1-to-2 format are possible, but, with high-speed operations required, couplings are made in a 1-to-1 format so as to reduce external loads. For the CS signals, 1-to-1 couplings are made so as to realize various functions required according to the LPDDR4 standard. For the DQ and DQS signals shown in FIGS. 2 and 3, though not shown in FIG. 10, and for the DMI signal not shown in FIGS. 2 and 3, too, couplings are made in a 1-to-1 format so as to realize various functions required according to the LPDDR4 standard.

The above configuration, however, may cause the following two concerns. The first of the two concerns is that, with the termination resistors for the CA signals set to (2×R) Ω each, an impedance mismatch may occur between the CS and CK signals. The second of the two concerns is that reference voltage Vref may cause signal jittering. To be specific about the second concern, in the LPDDR4 memory chip, the receiver circuit RVcs for the CS signals and the receiver circuits RVc[0] to RVc[5] for the CA signals determine signal logic levels based on common reference voltage Vref as described with reference to FIG. 2. For this, the reference voltage Vref is automatically adjusted to an optimum value during a training period.

However, while the resistance value of each termination resistor for the CS signal is (2×R) Ω, each termination resistor for the CA signal has an equivalent resistance value of R Ω. This resistance value difference causes the CS signal to have a larger voltage amplitude than the CA signal. This generates a difference between the optimum value of reference voltage Vref for the CS signal and the optimum value of reference voltage Vref for the CA signal. This causes jittering of the respective signals. The problem like this does not occur for the CK signal that is a differential signal not dependent on the reference voltage Vref.

Figure 11:
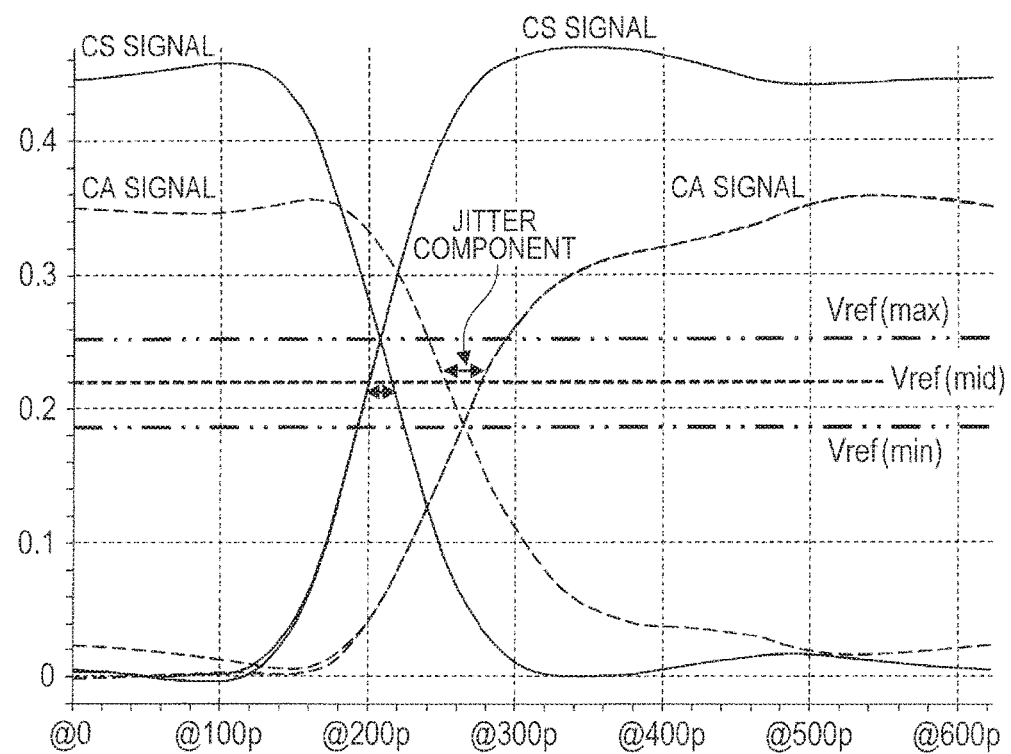
FIG. 11 is a waveform diagram showing example voltage amplitudes of CS and CA signals in the electronic device according to the third embodiment of the present invention.

FIG. 11 is a waveform diagram showing example voltage amplitudes of CS and CA signals in the electronic device according to the third embodiment of the present invention. In the LPDDR4 memory chip, a termination method called LVSTL (low voltage swing terminated logic) is used for ground supply voltage VSS. Hence, as shown in FIG. 11, when the resistance values of termination resistors for various signals mutually differ whereas the drive currents provided by the corresponding driver circuits are mutually equivalent, the voltage amplitudes of the respective signals based on ground supply voltage VSS mutually differ causing the optimum values of reference voltage Vref to also differ between the signals.

Referring to FIG. 11, the optimum value of the reference voltage Vref is Vref (max) for the CS signal and is Vref (min) for the CA signal. The internal reference voltage generation circuit VREFG shown in FIG. 2 sets the reference voltage Vref to Vref (mid) which is an intermediate value between Vref (max) and Vref (min) during a training period. In this case, however, as shown in FIG. 11, the difference between Vref (max) optimum for the CS signal and Vref (mid) causes jittering of the CS signal and the difference between Vref (min) optimum for the CA signal and Vref (mid) causes jittering of the CA signal.

To address the first concern, it may be conceivable to set the resistance value of each termination register to R Ω instead of (2×R) Ω used in the third embodiment. For this, either the resistance value of each termination resistor for the CA signal may be set to a composite resistance value of ((½)×R) Ω or a fly-by topology like the one shown in FIG. 7A may be used. When the latter method is used, the second concern can be addressed, but there may be cases where, as described with reference to FIG. 7B, satisfactory waveform quality cannot be secured.

In the former method on the other hand, impedance matching is made for the CS and CK signals at the sacrifice of impedance matching for the CA signal. In this regard, according to the third embodiment, whereas couplings are made in a 1-to-1 format for the CS and CK signals, couplings are made in a 1-to-2 format for the CA signal. This increases an external load on the CA signal, particularly in a two-rank configuration. It is, therefore, important to secure the waveform quality of the CA signal on a priority basis.

From this point of view, it is beneficial to perform impedance matching for the CA signal even at the sacrifice of impedance matching for the CS and CK signals. As for the CS and CK signals, the couplings are made in a 1-to-1 format and, moreover, impedance matching is made on the controller device CTLDE side. Thus, regarding the CS and CK signals, the present inventors have ascertained that practically satisfactory waveform quality can be secured.

As an alternative approach for addressing the first and second concerns, it is conceivable to provide termination resistors for the CS and CK signals over the wiring substrate BD. To be more concrete, refer to FIG. 10. An external resistor of (2×R) it may be coupled between external terminal PNm (CS0_A) and ground supply voltage VSS over the wiring substrate BD. This makes the termination resistor at the external terminal PNm (CS0_A) have an equivalent resistance value of R Ω.

However, the present inventors have ascertained that, as for the CS and CK signals, no particular problem is caused even when such an alternative approach is not used. Namely, by securing the waveform quality of the CA signal by means of impedance matching and the waveform quality of the CS and CK signals by making couplings in a 1-to-1 format, even though jittering associated with reference voltage Vref occurs as shown in FIG. 11, jittering associated with signal waveform quality can be reduced. Namely, it has been ascertained that, in the above manner, overall jitter components can be held adequately in a tolerable range.

As described above, the electronic device of the third embodiment makes it possible, while also realizing various advantageous effects described in connection with the first and second embodiments, to secure adequate waveform quality without requiring any external termination resistor. This eventually makes it possible to reduce the size and cost of the electronic device.

The invention made by the present inventors has been described in concrete terms based on embodiments, but the invention is not limited to the embodiments and can be modified in various ways without departing from the scope and spirit of the invention. For example, the foregoing embodiments have been described in detail so as to make the invention easily understandable, but the invention is not defined to include all the configurations of the embodiments. Furthermore, the configuration of an embodiment may be partly replaced by a part of the configuration of another embodiment or may be added to by a part of the configuration of another embodiment. Also, the configuration of any embodiment may be partly removed.

Though the embodiments have been described based on an example of an electronic device (SiP) including an LPDDR4 memory device DDRDE and a controller device CTLDE for the memory device, application of the embodiments is not limited to such an electronic device. The embodiments can be applied to various types of electronic devices as methods of impedance matching between a device (semiconductor device) having an output terminal and a device (semiconductor device) having two input terminals commonly couplable to the output terminal.

What is claimed is:

1. An electronic device, comprising:
   a first semiconductor device including a first input terminal and a second input terminal;
   a second semiconductor device including a first output terminal and a first driver circuit to drive the first output terminal;
   a wiring substrate over which the first and second semiconductor devices are mounted;
   a first termination resistor to terminate the first input terminal; and
   a second termination resistor to terminate the second input terminal,
   wherein the first and second input terminals are commonly coupled to the first output terminal via a first line formed on the wiring substrate, and
   wherein a composite resistance value of the first and second termination resistors is equivalent to a drive impedance of the first driver circuit.

2. The electronic device according to claim 1, wherein a resistance value of the first termination resistor is equal to a resistance value of the second termination resistor.

3. The electronic device according to claim 2,
   wherein the first semiconductor device further includes a first memory array and a second memory array,
   wherein the first input terminal receives an access command for accessing the first memory array, and
   wherein the second input terminal receives an access command for accessing the second memory array.

4. The electronic device according to claim 3,
   wherein the first and second memory arrays are formed in a first semiconductor chip, and
   wherein the first and second termination resistors are formed in the first semiconductor chip.

5. The electronic device according to claim 4,
wherein the first semiconductor chip is an LPDDR (low power double data rate) memory chip, and
wherein the first and second input terminals receive CA (command address) signals.

6. The electronic device according to claim 5, wherein the resistance value of each of the first and second termination resistors is 80 ohms.

7. The electronic device according to claim 5,
wherein the first semiconductor device further includes:
a third input terminal to receive a CS (chip select) signal for input to the first memory array and a fourth input terminal to receive a CS (chip select) signal for input to the second memory array; and
a third termination resistor to terminate the third input terminal and a fourth termination resistor to terminate the fourth input terminal,
wherein the second semiconductor device further includes:
a second output terminal and a third output terminal; and
a second driver circuit to drive the second output terminal and a third driver circuit to drive the third output terminal,
wherein the third input terminal is coupled to the second output terminal via a second line formed on the wiring substrate, and
wherein the fourth input terminal is coupled to the third output terminal via a third line formed on the wiring substrate.

8. The electronic device according to claim 7,
wherein each of the third and fourth termination resistors has a resistance value equal to the resistance value of the first termination resistor, and
wherein each of the second and third driver circuits has a drive impedance equivalent to the drive impedance of the first driver circuit.

9. The electronic device according to claim 2,
wherein the first line is formed in a T-branch topology in which the first line extending from the first output terminal is T-branched and is coupled to the first input terminal and the second input terminal, and
wherein a characteristic impedance of the line after being T-branched is larger than a characteristic impedance of the line before being T-branched.

10. An electronic device, comprising:
a first semiconductor device including a first input terminal and a second input terminal;
a second semiconductor device including a first output terminal;
a wiring substrate over which the first and second semiconductor devices are mounted;
a first termination resistor to terminate the first input terminal; and
a second termination resistor to terminate the second input terminal,
wherein the first and second input terminals are commonly coupled to the first output terminal via a first line formed on the wiring substrate, and
wherein a composite resistance value of the first and second termination resistors is set to match a characteristic impedance of the first line.

11. The electronic device according to claim 10, wherein a resistance value of the first termination resistor equals a resistance of the second termination resistor.

12. The electronic device according to claim 11,
wherein the first semiconductor device further includes a first memory array and a second memory array,
wherein the first input terminal receives an access command for accessing the first memory array, and
wherein the second input terminal receives an access command for accessing the second memory array.

13. The electronic device according to claim 12,
wherein the first and second memory arrays are formed in a first semiconductor chip, and
wherein the first and second termination resistors are formed in the first semiconductor chip.

14. The electronic device according to claim 13,
wherein the first semiconductor chip is an LPDDR (low power double data rate) memory chip, and
wherein the first and second input terminals receive CA (command address) signals.

15. The electronic device according to claim 11,
wherein the first line is formed in a T-branch topology in which the first line extending from the first output terminal is T-branched and is coupled to the first input terminal and the second input terminal, and
wherein a characteristic impedance of the line after being T-branched is larger than a characteristic impedance of the line before being T-branched.

16. An electronic device, comprising:
a first semiconductor device including a first input terminal, a second input terminal, a third input terminal and a fourth input terminal;
a second semiconductor device including a first output terminal, a second output terminal and a third output terminal;
a wiring substrate over which the first and second semiconductor devices are mounted; and
a first termination resistor, a second termination resistor, a third termination resister and a fourth termination resistor to terminate the first input terminal, the second input terminal, the third input terminal and the fourth input terminal, respectively,
wherein the first and second input terminals are commonly coupled to the first output terminal via a first line formed on the wiring substrate,
wherein the third input terminal is coupled to the second output terminal via a second line formed on the wiring substrate,
wherein the fourth input terminal is coupled to the third output terminal via a third line formed on the wiring substrate,
wherein each of the first to fourth termination resistors has a first resistance value,
wherein a characteristic impedance of each of the first to third lines is equivalent to one another, and
wherein the first resistance value is set such that a composite resistance value of the first and second termination resistors matches the characteristic impedance of the first line.

17. The electronic device according to claim 16,
wherein the first semiconductor device further includes a first memory array and a second memory array,
wherein the first and third input terminals receive access commands for accessing the first memory array, and
wherein the second and fourth input terminals receive access commands for accessing the second memory array.

18. The electronic device according to claim 17,
wherein the first and second memory arrays are formed in a same LPDDR (low power double data rate) memory chip, and
wherein the first to fourth termination resistors are formed in the memory chip.

19. The electronic device according to claim 18,
wherein the first and second input terminals receive CA (command address) signals, and
wherein the third and fourth input terminals receive CS (chip select) signals.

20. The electronic device according to claim 16,
wherein the first line is formed in a T-branch topology in which the first line extending from the first output terminal is T-branched and is coupled to the first input terminal and the second input terminal, and
wherein a characteristic impedance of the line after being T-branched is larger than a characteristic impedance of the line before being T-branched.

* * * * *